United States Patent
Wu et al.

(10) Patent No.: US 12,411,176 B2
(45) Date of Patent: Sep. 9, 2025

(54) CIRCUIT, METHOD, AND APPARATUS FOR DIAGNOSING A FAULT, AND COMPUTER READABLE STORAGE MEDIUM

(71) Applicant: Horizon (Shanghai) Artificial Intelligence Technology Co., Ltd., Shanghai (CN)

(72) Inventors: Zheng Wu, Shanghai (CN); Wenxing Li, Shanghai (CN); Yi Zhou, Shanghai (CN); Jing Li, Shanghai (CN); Qingyu Liu, Shanghai (CN)

(73) Assignee: Horizon (Shanghai) Artificial Intelligence Technology Co., Ltd., Shanghai (CN)

( * ) Notice: Subject to any disclaimer, the term of this patent is extended or adjusted under 35 U.S.C. 154(b) by 0 days.

(21) Appl. No.: 18/261,435

(22) PCT Filed: Aug. 18, 2022

(86) PCT No.: PCT/CN2022/113373
§ 371 (c)(1),
(2) Date: Jul. 13, 2023

(87) PCT Pub. No.: WO2023/020586
PCT Pub. Date: Feb. 23, 2023

(65) Prior Publication Data
US 2024/0069098 A1    Feb. 29, 2024

(30) Foreign Application Priority Data
Aug. 20, 2021 (CN) .......................... 202110958241.7

(51) Int. Cl.
*G01R 31/3187* (2006.01)
*G01R 31/00* (2006.01)
(Continued)

(52) U.S. Cl.
CPC ...... *G01R 31/3187* (2013.01); *G06F 11/1048* (2013.01)

(58) Field of Classification Search
CPC . G01R 31/3187; G06F 11/1048; G06F 11/22; G06F 11/2273; Y04S 10/52
See application file for complete search history.

(56) References Cited

U.S. PATENT DOCUMENTS

| | | |
|---|---|---|
| 4,485,467 A | 11/1984 | Miles et al. |
| 5,825,783 A | 10/1998 | Momohara |

(Continued)

FOREIGN PATENT DOCUMENTS

| | | |
|---|---|---|
| CN | 1163475 A | 10/1997 |
| CN | 108073837 A | 5/2018 |

(Continued)

OTHER PUBLICATIONS

First Japanese Office Action from the corresponding Japanese Patent Application No. 2023-542630, mailed on Aug. 6, 2024.
(Continued)

*Primary Examiner* — Justin R Knapp
(74) *Attorney, Agent, or Firm* — K&L Gates LLP

(57) ABSTRACT

Disclosed are a fault diagnosis circuit, method and apparatus, and computer readable storage medium. The fault diagnosis circuit includes a safety protection circuit electrically connected to a protected circuit and a diagnosis module electrically connected to the safety protection circuit. The safety protection circuit is configured to perform check operation on stored data in the protected circuit to obtain first check data, perform error injection on second check data corresponding to the stored data, and generate a first check result signal based on the first check data and the second check data after the error injection. The diagnosis module is configured to diagnose faults in the safety protection circuit (Continued)

based on the first check result signal. From embodiments of this disclosure, the safety protection circuit is diagnosed faults through a simple hardware structure, to eliminate the faults based on a diagnosis result, thereby ensuring normal operation of a chip.

13 Claims, 6 Drawing Sheets

(51) Int. Cl.
    *G06F 11/00*     (2006.01)
    *G06F 11/10*     (2006.01)

(56) References Cited

U.S. PATENT DOCUMENTS

| | | | |
|---|---|---|---|
| 10,768,227 B2 * | 9/2020 | Pillay | G01R 31/31816 |
| 10,824,529 B2 * | 11/2020 | Chaudhari | G06F 11/2215 |
| 11,335,428 B2 * | 5/2022 | Azam | G11C 29/36 |
| 11,550,979 B2 * | 1/2023 | De | G06F 30/30 |
| 2008/0301528 A1 | 12/2008 | Doi | |
| 2018/0137311 A1 | 5/2018 | Liu et al. | |
| 2019/0176838 A1 | 6/2019 | Kakoee et al. | |
| 2019/0227867 A1 | 7/2019 | Ellur | |
| 2021/0311832 A1 * | 10/2021 | Boschi | G06F 11/263 |
| 2024/0211361 A1 | 6/2024 | Li et al. | |

FOREIGN PATENT DOCUMENTS

| | | |
|---|---|---|
| CN | 108600047 A | 9/2018 |
| CN | 111624477 A | 9/2020 |
| CN | 112506730 A | 3/2021 |
| CN | 112948167 A | 6/2021 |
| CN | 113295943 A | 8/2021 |
| CN | 113656230 A | 11/2021 |
| EP | 4120084 A1 | 1/2023 |
| EP | 4246153 A1 | 9/2023 |
| FR | 2867326 A1 | 9/2005 |
| JP | H06259270 A | 9/1994 |
| JP | 2008299767 A | 12/2008 |
| JP | 2015197729 A | 11/2015 |
| WO | 2007096997 A1 | 8/2007 |
| WO | 2023020586 A1 | 2/2023 |

OTHER PUBLICATIONS

Extended European Search Report from the corresponding European Patent Application No. 22857895.1, mailed on Nov. 8, 2024.
International Search Report and Written Opinion for International PCT Application No. PCT/CN2022/113373, dated Nov. 4, 2022 (English Translation of Search Report).

* cited by examiner

CIRCUIT, METHOD, AND APPARATUS FOR DIAGNOSING A FAULT, AND COMPUTER READABLE STORAGE MEDIUM

CROSS-REFERENCE TO RELATED APPLICATIONS

This application is a U.S. National Stage Entry under 35 U.S.C. § 371 of International Patent Application No. PCT/CN2022/113373, entitled "FAULT DIAGNOSIS CIRCUIT, METHOD, AND APPARATUS, AND COMPUTER READABLE STORAGE MEDIUM", filed Aug. 18, 2022, which claims the priority to Chinese Patent Application No. 202110958241.7, filed with the China National Intellectual Property Administration on Aug. 20, 2021 and entitled "FAULT DIAGNOSIS CIRCUIT, METHOD, AND APPARATUS, AND COMPUTER READABLE STORAGE MEDIUM", the entire disclosures of which are incorporated herein by reference in their entirety.

FIELD OF THE INVENTION

This disclosure relates to the technical filed of fault diagnosis, and in particular, to a fault diagnosis circuit, method, and apparatus, and a computer readable storage medium.

BACKGROUND OF THE INVENTION

Due to level requirements on functional safety, corresponding safety protection circuits are required by some circuits in a chip. It should be pointed out that the safety protection circuit itself may have a fault, which affects normal operation of the chip. Therefore, how to perform fault diagnosis on the safety protection circuit is an issue worthy of attention for a person skilled in the art.

SUMMARY OF THE INVENTION

To resolve the foregoing technical problem, this disclosure is proposed. Embodiments of this disclosure provide a fault diagnosis circuit, method, and apparatus, and a computer readable storage medium.

According to an aspect of an embodiment of this disclosure, a fault diagnosis circuit is provided, including a safety protection circuit and a diagnosis module, wherein
the safety protection circuit is electrically connected to a protected circuit, and is configured to perform a check operation on stored data in the protected circuit to obtain first check data, perform error injection on second check data corresponding to the stored data, and generate a first check result signal based on the first check data and the second check data performed with the error injection; and
the diagnosis module is electrically connected to the safety protection circuit, and the diagnosis module is configured to perform fault diagnosis on the safety protection circuit based on the first check result signal.

According to another aspect of an embodiment of this disclosure, a fault diagnosis method is provided, which is applicable to the foregoing fault diagnosis circuit, wherein the fault diagnosis method includes:
performing a check operation on stored data in a protected circuit to obtain first check data;
performing error injection on second check data corresponding to the stored data;
generating a first check result signal based on the first check data and the second check data performed with the error injection; and
performing fault diagnosis on a safety protection circuit in the fault diagnosis circuit based on the first check result signal.

According to still another aspect of an embodiment of this disclosure, a fault diagnosis apparatus is provided, which is applicable to the foregoing fault diagnosis circuit, wherein the fault diagnosis apparatus includes:
a first processing module, configured to perform a check operation on stored data in a protected circuit to obtain first check data;
a second processing module, configured to perform error injection on second check data corresponding to the stored data;
a first generation module, configured to generate a first check result signal based on the first check data obtained by the first processing module and the second check data performed with the error injection that is obtained by the second processing module; and
a third processing module, configured to perform fault diagnosis on a safety protection circuit in the fault diagnosis circuit based on the first check result signal generated by the first generation module.

According to yet another aspect of an embodiment of this disclosure, a computer readable storage medium is provided, wherein the storage medium stores a computer program, and the computer program is used for implementing the foregoing fault diagnosis method.

According to yet another aspect of an embodiment of this disclosure, an electronic device is provided, including:
a processor; and
a memory, configured to store processor-executable instructions,
wherein the processor is configured to read the executable instructions from the memory, and execute the instructions to implement the foregoing fault diagnosis method.

Based on the fault diagnosis circuit, method, and apparatus, the computer readable storage medium, and the electronic device that are provided in the foregoing embodiments of this disclosure, the safety protection circuit can generate the first check result signal by obtaining the check data and in combination with the error injection, and provide the generated first check result signal to the diagnosis module. The diagnosis module can perform fault diagnosis on the safety protection circuit based on the first check result signal. Therefore, according to embodiments of this disclosure, fault diagnosis can be performed on the safety protection circuit through a simple hardware structure, so that fault elimination can be performed based on a diagnosis result, thereby ensuring normal operation of a chip.

The technical solutions of this disclosure are further described below in detail with reference to the accompanying drawings and the embodiments.

BRIEF DESCRIPTION OF THE DRAWINGS

By describing the embodiments of this disclosure more detailed with reference to the accompanying drawings, the foregoing and other objectives, features, and advantages of this disclosure will become more apparent. The accompanying drawings are used to provide further understanding of the embodiments of this disclosure, constituting a part of the specification, and are used to explain this disclosure together with the embodiments of this disclosure, but do not consti

DETAILED DESCRIPTION OF THE EMBODIMENTS

Exemplary embodiments of this disclosure are described below in detail with reference to the accompanying drawings. Obviously, the described embodiments are merely a part, rather than all of embodiments of this disclosure. It should be understood that this disclosure is not limited by the exemplary embodiments described herein.

It should be noted that unless otherwise specified, the scope of this disclosure is not limited by relative arrangement of components and steps, numeric expressions, and numerical values described in these embodiments.

A person skilled in the art may understand that terms such as "first" and "second" in the embodiments of this disclosure are merely used to distinguish between different steps, devices, or modules, and indicate neither any particular technical meaning, nor necessarily logical ordering among them.

It should be further understood that, in the embodiments of this disclosure, the term "multiple"/"a plurality of" may refer to two or more; and the term "at least one" may refer to one, two, or more.

The embodiments of this disclosure can be applicable to a terminal device, a computer system, a server, and other electronic devices, which can be operated together with numerous other general-purpose or special-purpose computing system environments or configurations. Well-known examples of the terminal device, the computing systems, and environment and/or configuration applicable to be used with the terminal device, the computer system, the server, and other electronic devices include but are not limited to: a devices or system including a chip (such as an automotive chip, a ship chip, or an aircraft chip), a personal computer system, a server computer system, a thin client, a thick client, a handheld or laptop device, a microprocessor-based system, a set-top box, programmable consumer electronics, a network personal computer, a small computer system, a mainframe computer system, and a distributed cloud computing technology environment including any of the foregoing systems.

Application Overview

In a process of implementing this disclosure, the inventor finds that due to a requirement for a functional safety level, corresponding safety protection circuits are required by some circuits (which can be referred to as protected circuits) in a chip. The safety protection circuit can protect the protected circuit through a particular safety protection mechanism. Optionally, the chip may be a chip of a smart car, and the protected circuit may be a register.

It should be pointed out that the safety protection circuit may have a fault, which affects normal operation of the chip. To eliminate the fault of the safety protection circuit and ensure the normal operation of the chip, it is necessary to perform fault diagnosis on the safety protection circuit.

Exemplary System

Figure 1:
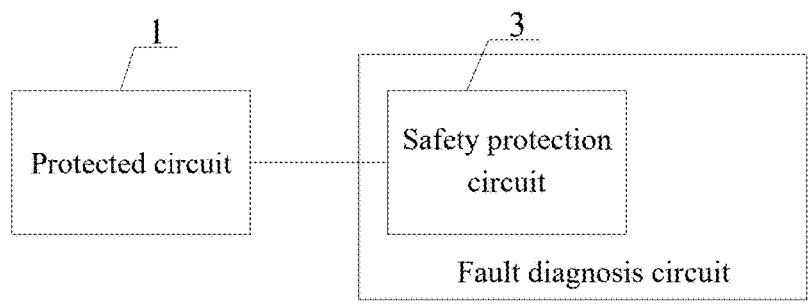
- FIG. 1 is a schematic diagram of a scenario to which this disclosure is applicable.

As shown in FIG. 1, corresponding to a protected circuit 1, a fault diagnosis circuit provided in an embodiment of this disclosure can be disposed. The fault diagnosis circuit can include a safety protection circuit 3. The safety protection circuit 3 can be electrically connected to the protected circuit 1. Through operation of the fault diagnosis circuit, fault diagnosis can be performed on the safety protection circuit 3. Optionally, fault diagnosis can also be performed on the protected circuit 1 through the operation of the fault diagnosis circuit.

It should be noted that logic gates such as a NOT gate, an OR gate, and an AND gate, and a multiplexer (MUX) are involved in embodiments of this disclosure.

Exemplary Circuit

Figure 2:
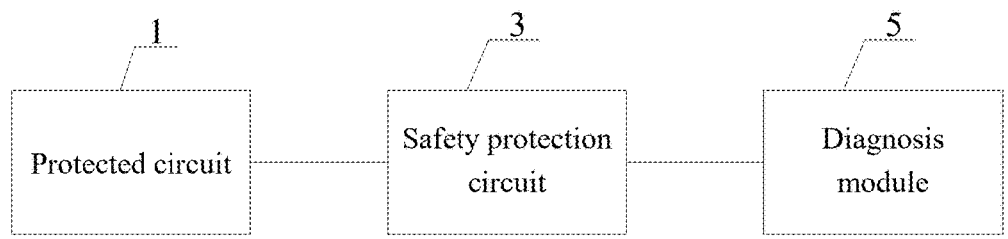
FIG. 2 is a schematic structural diagram of a fault diagnosis circuit according to an exemplary embodiment of this disclosure.

FIG. 2 is a schematic structural diagram of a fault diagnosis circuit according to an exemplary embodiment of this disclosure. As shown in FIG. 2, the fault diagnosis circuit includes a safety protection circuit 3 and a diagnosis module 5.

The safety protection circuit 3 is electrically connected to a protected circuit 1, and is configured to perform a check operation on stored data in the protected circuit 1 to obtain first check data, perform error injection on second check data corresponding to the stored data, and generate a first check result signal based on the first check data and the second check data performed with the error injection.

The diagnosis module 5 is electrically connected to the safety protection circuit 3. The diagnosis module 5 is configured to perform fault diagnosis on the safety protection circuit 3 based on the first check result signal.

Herein, the protected circuit 1 can be a circuit that can store data, such as a register. Optionally, the register can be a data register or a control register. It can be understood that the control register can be configured to control functional configurations of the entire chip, a subsystem in the chip, or a module in the chip. The data register can store a first-input-first-output (FIFO) queue of data, perform data caching, and the like. A register width can be 4 bits, 8 bits, 16 bits, 32 bits, or the like. Certainly, the register width is not limited to this, and specific selections can be made based on actual requirements. This is not limited in this embodiment of this disclosure.

In this embodiment of this disclosure, the safety protection circuit 3 can obtain the stored data in the protected circuit 1 through the electrical connection between the safety protection circuit 3 and the protected circuit 1. Subsequently, the safety protection circuit 3 can perform a check operation on the stored data according to a preset check manner to obtain the first check data.

Optionally, the safety protection circuit 3 can use a cyclic redundancy check (CRC) algorithm to perform a CRC operation on the stored data to obtain a corresponding CRC value, and use the obtained CRC value as the first check data. Alternatively, the safety protection circuit 3 can use a parity check algorithm to perform a parity check operation on the stored data to obtain a corresponding parity value, and use the obtained parity value as the first check data.

For ease of understanding, description is made in this embodiment of this disclosure by using an example in which the preset check manner is the parity check algorithm.

In addition, the safety protection circuit 3 can also obtain the second check data corresponding to the stored data. To obtain the second check data, the safety protection circuit 3 can be electrically connected to an advanced extensible interface (AXI) and a data bus such as an advanced peripheral bus (APB). The data bus can transmit data for storage, and the protected circuit 1 can specifically obtain the data for storage from the data bus and store the same. The data stored in the protected circuit 1 can be used as the stored data. The safety protection circuit 3 can obtain the second check data corresponding to the stored data based on the data bus.

Optionally, the safety protection circuit 3 can obtain the data for storage from the data bus and perform a check operation on the obtained data according to the preset check manner. The obtained check data can be used as the second check data corresponding to the stored data. Alternatively, in addition to transmitting the data for storage, the data bus can also transmit check data corresponding to the data for storage. The check data can be obtained by performing, according to the preset check manner, a check operation on the data for storage that is transmitted on the data bus. The check data transmitted on the data bus can be used as the second check data corresponding to the stored data.

After obtaining the second check data, the safety protection circuit 3 can perform error injection on the second check data to introduce an error into the second check data, so as to obtain the second check data performed with the error injection, so that the first check result signal is generated based on the first check data and the second check data performed with the error injection.

Optionally, the safety protection circuit 3 can compare the first check data with the second check data performed with the error injection, and generate the first check result signal based on a comparison result between the first check data and the second check data performed with the error injection. The first check result signal can be a signal that can be used to determine whether the first check data and the second check data performed with the error injection are the same.

After the first check result signal is generated by the safety protection circuit 3, the diagnosis module 5 can obtain the first check result signal through the electrical connection between the diagnosis module 5 and the safety protection circuit 3, so as to perform fault diagnosis on the safety protection circuit 3 based on the first check result signal, for example, determine whether there is a fault in the safety protection circuit 3.

In the fault diagnosis circuit provided in this embodiment of this disclosure, the safety protection circuit 3 can generate the first check result signal by obtaining the check data and in combination with the error injection, and provide the generated first check result signal to the diagnosis module 5. The diagnosis module 5 can perform fault diagnosis on the safety protection circuit 3 based on the first check result signal. Therefore, according to this embodiment of this disclosure, fault diagnosis can be performed on the safety protection circuit 3 through a simple hardware structure, so that fault elimination can be performed based on a diagnosis result, thereby ensuring normal operation of the chip.

In an optional example, the safety protection circuit 3 is further configured to generate a second check result signal based on the first check data and the second check data, and the diagnosis module 5 is further configured to perform fault diagnosis on the protected circuit 1 based on the second check result signal.

In this embodiment of this disclosure, the safety protection circuit 3 can further compare the first check data with the second check data, and generate the second check result signal based on the comparison result between the first check data and the second check data. The second check result signal can be a signal that can be used to determine whether the first check data and the second check data are the same.

After the second check result signal is generated by the safety protection circuit 3, the diagnosis module 5 can obtain the second check result signal through the electrical connection between the diagnosis module 5 and the safety protection circuit 3, so as to perform fault diagnosis on the protected circuit 1 based on the second check result signal, for example, determine whether there is a fault in the protected circuit 1.

In view of the above, in this embodiment of this disclosure, through the simple hardware structure, not only fault diagnosis can be performed on the safety protection circuit 3, but also fault diagnosis can be performed on the protected circuit 1, so that fault elimination can be performed based on the diagnosis result, thereby further ensuring the normal operation of the chip.

Figure 3:
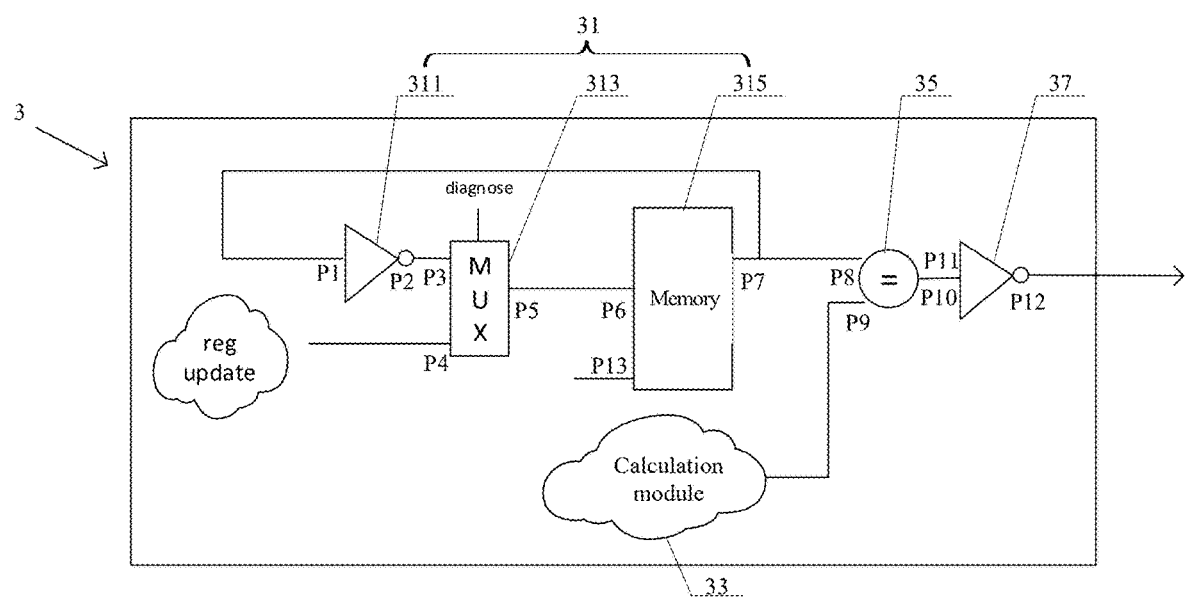
FIG. 3 is a schematic structural diagram of a safety protection circuit in a fault diagnosis circuit according to an exemplary embodiment of this disclosure.

In an optional example, as shown in FIG. 3, the safety protection circuit 3 may include a processing module 31, a calculation module 33, and a comparison module 35.

The comparison module 35 is respectively electrically connected to the processing module 31, the calculation module 33, and the diagnosis module 5 in FIG. 2. The calculation module 33 is further electrically connected to the protected circuit 1.

The calculation module 33 is configured to perform a check operation on the stored data to obtain the first check data.

The processing module 31 is configured to perform error injection on the second check data.

The comparison module 35 is configured to generate a third check result signal based on a comparison result between the first check data and the second check data performed with the error injection. The first check result signal is generated based on the third check result signal.

The comparison module 35 is further configured to generate a fourth check result signal based on the comparison result between the first check data and the second check data. The second check result signal is generated based on the fourth check result signal.

Herein, the comparison module 35 can be a comparator.

In a specific implementation, the processing module 31 includes a first NOT gate 311, a first multiplexer 313, and a memory 315.

The first multiplexer 313 is electrically connected to the memory 315. The memory 315 is further electrically connected to the first multiplexer 313 through the first NOT gate 311. The first multiplexer 313 is electrically connected to the data bus. The memory 315 is further electrically connected to the comparison module 35.

When the fault diagnosis circuit is in a first working mode, the first multiplexer 313 is configured to output the second check data that is obtained based on the data bus, so that the memory 315 stores the second check data and outputs the second check data to the comparison module 35.

When the fault diagnosis circuit is in a second working mode, the first multiplexer 313 is configured to output a negation result of the second check data stored in the memory 315 which is inverted by the first NOT gate 311, so that the memory 315 outputs the negation result of the second check data to the comparison module 35. The negation result of the second check data is used as the second check data performed with the error injection.

Herein, the first NOT gate 311 can have a first port P1 and a second port P2. The first multiplexer 313 can have a third port P3, a fourth port P4, and a fifth port P5. The memory 315 can have a sixth port P6 and a seventh port P7. The comparison module 35 can have an eighth port P8, a ninth port P9, and a tenth port P10. The first port P1 can be electrically connected to the seventh port P7. The second port P2 can be electrically connected to the third port P3. The fourth port P4 can be electrically connected to the data bus. The fifth port P5 can be electrically connected to the sixth port P6. The seventh port P7 can be electrically connected to the eighth port P8. The ninth port P9 can be electrically connected to the calculation module 33. The tenth port P10 can be electrically connected to the diagnosis module 5.

It should be noted that the first port P1 can serve as an input end of the first NOT gate 311; the second port P2 can serve as an output end of the first NOT gate 311; the third port P3 and the fourth port P4 can serve as an input end of the first multiplexer 313 respectively; the fifth port P5 can serve as an output end of the first multiplexer 313; the eighth port P8 and the ninth port P9 can serve as an input end of the comparison module 35 respectively; and the tenth port P10 can serve as an output end of the comparison module 35.

Herein, the fault diagnosis circuit can include two working modes, which are respectively the first working mode and the second working mode. In the first working mode, fault diagnosis can be performed on the protected circuit 1, and the first working mode can also be referred to as a normal working mode. In the second working mode, fault diagnosis can be performed on the safety protection circuit 3, and the second working mode can also be referred to as an error injection mode.

In this embodiment of this disclosure, because the calculation module 33 is configured to perform a check operation on the stored data to obtain the first check data, regardless of whether the fault diagnosis circuit is in the first working mode or the second working mode, the comparison module 35 can obtain, from the ninth port P9, the first check data that is from the calculation module 33.

When the fault diagnosis circuit is in the first working mode, the first multiplexer 313 can receive the second check data from the fourth port P4 (the second check data is from reg update in FIG. 3, and the logic at the reg update can be: obtaining data for storage from the data bus, performing a check operation on the obtained data according to the preset check manner, and using the obtained check data as the second check data corresponding to the stored data), and output the received second check data from the fifth port P5. The memory 315 can receive, from the sixth port P6, the second check data that is from the first multiplexer 313, and store the received second check data. The memory 315 can further output the received second check data from the seventh port P7. The comparison module 35 can receive, from the eighth port P8, the second check data that is from memory 315. Subsequently, the comparison module 35 can compare the first check data received from the ninth port P9 with the second check data received from the eighth port P8 to generate the fourth check result signal based on the comparison result between the first check data and the second check data.

The fourth check result signal can be used to indicate whether the first check data and the second check data are the same. When the first check data and the second check data are the same, the fourth check result signal may be a high-level signal, and may be represented by "1". Otherwise, the fourth check result signal may be a low-level signal, and may be represented by "0".

It should be pointed out that the fourth check result signal can be subsequently used to generate the second check result signal.

When the fault diagnosis circuit is in the second working mode, the memory 315 can output the stored second check data from the seventh port P7. The first NOT gate 311 can receive, from the first port P1, the second check data that is from the memory 315, and output a negation result of the second check data from the second port P2 after negation processing is performed on the received second check data. When the second check data is represented by "1", the negation result of the second check data is represented by "0". When the second check data is represented by "0", the negation result of the second check data is represented by "1". The first multiplexer 313 can receive, from the third port P3, the negation result that is of the second check data and that is from the first NOT gate 311, and output the received negation result of the second check data from the fifth port P5. The memory 315 can receive, from the sixth port P6, the negation result that is of the second check data and that is from the first multiplexer 313, and output the received negation result of the second check data from the seventh port P7. The comparison module 35 can receive, from the eighth port P8, the negation result that is of the second check data and that is from the memory 315. In this way, the comparison module 35 is equivalent to receiving the second check data performed with the error injection from the eighth port P8. Subsequently, the comparison module 35 can compare the first check data received from the ninth port P9 with the second check data performed with the error injection that is received from the eighth port P8 to generate the third check result signal based on the comparison result between the first check data and the second check data performed with the error injection.

The third check result signal can be used to indicate whether the first check data and the second check data performed with the error injection are the same. When the first check data and the second check data performed with the error injection are the same, the third check result signal may be a high-level signal, and may be represented by "1". Otherwise, the third check result signal may be a low-level signal, and may be represented by "0".

It should be pointed out that the third check result signal can be subsequently used to generate the first check result signal.

Optionally, the first multiplexer 313 can receive a diagnosis signal. Based on the received diagnosis signal, the first multiplexer 313 can determine whether the fault diagnosis circuit is currently in the first working mode or the second working mode, and further determine, based on the determined working mode, whether the second check data or the second check data performed with the error injection is output from the fifth port P5.

It should be noted that the diagnosis signal received by first multiplexer 313 may be directly from a central processing unit (CPU); or the diagnosis signal received by the first multiplexer 313 may be directly from a register dedicated to storing the diagnosis signal. The diagnosis signal in the register can be written by the CPU.

Optionally, to generate the first check result signal and the second check result signal, the safety protection circuit further includes a second NOT gate 37.

The comparison module 35 is electrically connected to the diagnosis module 5 through the second NOT gate 37. A negation result of the third check result signal which is inverted by the second NOT gate 37 is used as the first check result signal, and a negation result of the fourth check result signal which is inverted by the second NOT gate 37 is used as the second check result signal.

Herein, referring to FIG. 3, the second NOT gate 37 can have an eleventh port P11 and a twelfth port P12. The eleventh port P11 can be electrically connected to the tenth port P10, and the twelfth port P12 can be electrically connected to the diagnosis module 5. It should be noted that the eleventh port P11 can serve as an input end of the second NOT gate 37, and the twelfth port P12 can serve as an output end of the second NOT gate 37.

When the fault diagnosis circuit is in the first working mode, the comparison module 35 can output the fourth check result signal from the tenth port P10, and the second NOT gate 37 can receive, from the eleventh port P11, the fourth check result signal that is from the comparison module 35. The second NOT gate 37 can perform negation processing on the received fourth check result signal to obtain the negation result of the fourth check result signal, and output the negation result of the fourth check result signal from the twelfth port P12.

When the fourth check result signal is represented by "1", the negation result of the fourth check result signal is represented by "0". When the fourth check result signal is represented by "0", the negation result of the fourth check result signal is represented by "1".

Further, the diagnosis module 5 can receive the negation result of the fourth check result signal that is from the comparison module 35. In this way, the diagnosis module 5 is equivalent to receiving the second check result signal. The diagnosis module 5 can perform fault diagnosis on the protected circuit 1 based on the second check result signal.

When the fault diagnosis circuit is in the second working mode, the comparison module 35 can output the third check result signal from the tenth port P10, and the second NOT gate 37 can receive, from the eleventh port P11, the third check result signal that is from the comparison module 35. The second NOT gate 37 can perform negation processing on the received third check result signal to obtain the negation result of the third check result signal, and output the negation result of the third check result signal from the twelfth port P12.

When the third check result signal is represented by "1", the negation result of the third check result signal is represented by "0". When the third check result signal is represented by "0", the negation result of the third check result signal is represented by "1".

Further, the diagnosis module 5 can receive the negation result of the third check result signal that is from the comparison module 35. In this way, the diagnosis module 5 is equivalent to receiving the first check result signal. The diagnosis module 5 can perform fault diagnosis on the safety protection circuit 3 based on the first check result signal.

In view of the above, based on the negation processing at the second NOT gate 37, the second check result signal can be efficiently and reliably generated based on the fourth check result signal and the first check result signal can be efficiently and reliably generated based on the third check result signal.

Certainly, the second NOT gate 37 may not be specifically disposed in the safety protection circuit 3. In this case, the tenth port P10 can be directly connected to the diagnosis module 5 rather than being electrically connected to the diagnosis module 5 through the second NOT gate 37. In this case, the third check result signal can be directly used as the first check result signal, and the fourth check result signal can be directly used as the second check result signal.

In this embodiment of this disclosure, a check operation can be performed efficiently and reliably through the calculation module 33 to obtain the first check data. By using the processing module 31 that includes the first NOT gate 311, the first multiplexer 313, and the memory 315, error injection can be performed on the second check data efficiently and reliably through negation processing in a meta-circuit, without specifically calculating an error value to serve as the second check data performed with the error injection. Subsequently, by using the comparison module 35, it is possible to efficiently and reliably compare corresponding check data and generate corresponding check result signals, so that fault diagnosis is performed on the safety protection circuit 3 and the protected circuit 1 based on the generated check result signals.

It should be noted that the stored data in the protected circuit 1 can be updated. For example, the CPU can update the stored data through the data bus. For another example, the protected circuit 1 can update the stored data through a circuit of hardware thereof. When the stored data in the protected circuit 1 is updated, the second check data stored in the memory 315 also needs to be updated accordingly.

Optionally, as shown in FIG. 3, the memory 315 can further have a thirteenth port P13. The thirteenth port P13 can be electrically connected to a particular circuit. The particular circuit can generate control judgment logic based on a signal transmitted on the data bus and/or some of the signals involved in FIG. 3. The control judgment logic can be used to control an update condition of the second check data stored in the memory 315.

Figure 4:
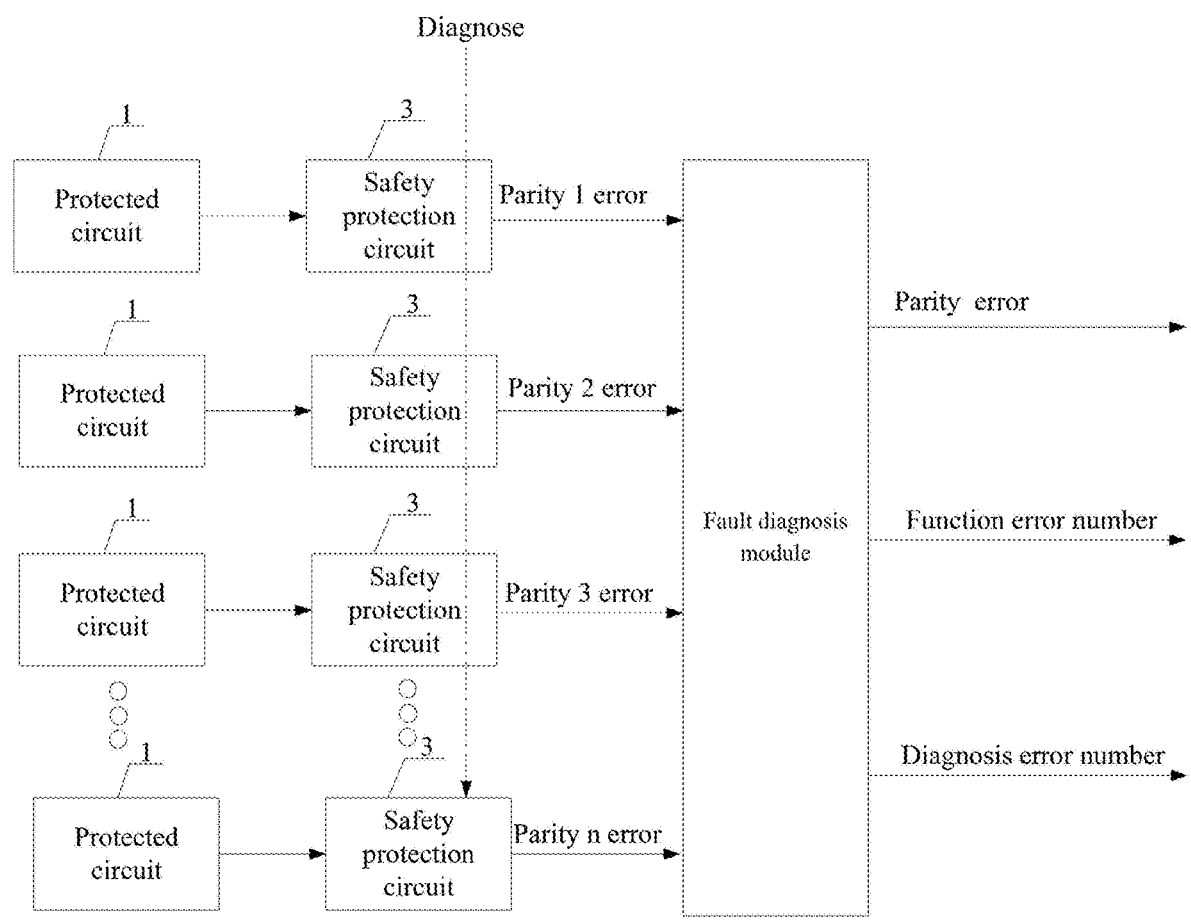
FIG. 4 is a schematic structural diagram of a fault diagnosis circuit according to another exemplary embodiment of this disclosure.
Figure 5:
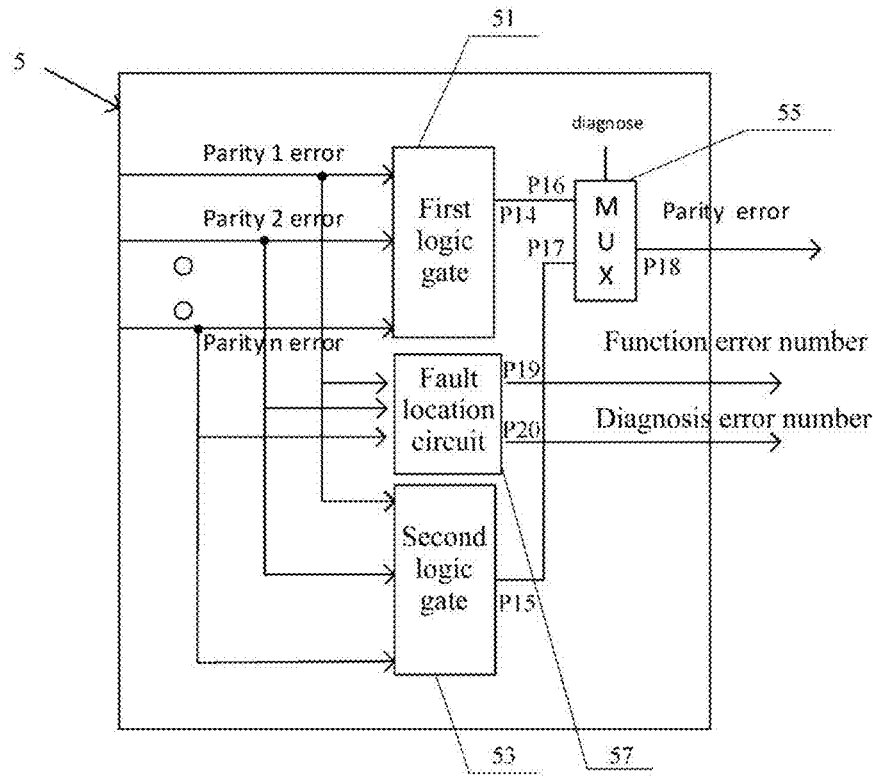
FIG. 5 is a schematic structural diagram of a diagnosis module in a fault diagnosis circuit according to an exemplary embodiment of this disclosure.

In an optional example, as shown in FIG. 4, there are a plurality of safety protection circuits 3 and a plurality of protected circuits 1. The plurality of safety protection circuits 3 are electrically connected to the plurality of protected circuits 1 correspondingly. As shown in FIG. 5, the diagnosis module 5 includes a first logic gate 51, a second logic gate 53, and a second multiplexer 55.

The first logic gate 51 and the second logic gate 53 are respectively electrically connected to each safety protection circuit 3, and the first logic gate 51 and the second logic gate 53 are further electrically connected to the second multiplexer 55.

When the fault diagnosis circuit is in the first working mode, the second multiplexer 55 is configured to output a first operation result signal obtained by performing, by the first logic gate 51, a first logical operation on a plurality of second check result signals that are generated by the plurality of safety protection circuits 3. The first operation result signal is used to indicate whether the protected circuit 1 with a fault exists in the plurality of protected circuits 1.

When the fault diagnosis circuit is in the second working mode, the second multiplexer 55 is configured to output a second operation result signal obtained by performing, by the second logic gate 53, a second logical operation on a plurality of first check result signals that are generated by the plurality of safety protection circuits 3. The second operation result signal is used to indicate whether the safety protection circuit 3 with a fault exists in the plurality of safety protection circuit circuits 3.

Herein, there may be a plurality of (for example, n) safety protection circuits 3 and protected circuits 1, where n can be 2, 3, 4, 5, or an integer greater than 5. The plurality of safety protection circuits 3 can be electrically connected to the plurality of protected circuits 1 in one-to-one correspondence.

Herein, the first logic gate 51 may be an OR gate, the first logical operation may be an OR operation, the second logic gate 53 may be an AND gate, and the second logical operation may be an AND operation. Alternatively, the first logic gate 51 may be an AND gate, the first logical operation may be an AND operation, the second logic gate 53 may be an OR gate, and the second logical operation may be an OR operation.

Herein, the first logic gate 51 can have a fourteenth port P14, the second logic gate 53 can have a fifteenth port P15, and the second multiplexer 55 can have the sixteenth port P16, a seventeenth port P17, and an eighteenth port P18. The sixteenth port P16 can be electrically connected to the fourteenth port P14, and the seventeenth port P17 can be electrically connected to the fifteenth port P15.

It should be noted that the fourteenth port P14 can serve as an output end of the first logic gate 51, the fifteenth port P15 can serve as an output end of the second logic gate 53, the sixteenth port P16 and the seventeenth port P17 respectively serve as an input end of the second multiplexer 55, and the eighth port P18 serves as an output end of the second multiplexer 55.

When the fault diagnosis circuit is in the first working mode, the plurality of safety protection circuits 3 can output second check result signals generated thereby. The first logic gate 51 can receive a plurality of second check result signals (equivalent to a parity 1 error to a parity n error in FIG. 4 and FIG. 5 in the first working mode) through a plurality of input ends, perform a first logical operation on the plurality of received second check result signals to obtain the first operation result signals (equivalent to a parity error in FIG. 4 and FIG. 5 in the first working mode), and output the first operation result signals from the fourteenth port P14.

Further, the second multiplexer 55 can receive, from the sixteenth port P16, the first operation result signals that are from first logic gate 51, and output the received first operation result signals from the eighth port P18. Based on the first operation result signals, a related person can learn whether the protected circuit 1 with a fault exists in the plurality of protected circuits 1.

In a specific example, each safety protection circuit 3 is provided with the second NOT gate 37 shown in FIG. 3. Theoretically, if there are no faults in the plurality of protected circuits 1, in the first working mode, the parity 1 error to the parity n error in FIG. 4 and FIG. 5 can all be represented by "0". Otherwise, in the first working mode, at least some of the parity 1 error to the parity n error in FIG. 4 and FIG. 5 can be represented by "1".

In view of the above, it can be determined that if the first logic gate 51 is an OR gate, when the parity error in the first working mode is represented by "0", it can be considered that no protected circuit 1 with a fault exists in the plurality of protected circuits 1. When the parity error in the first working mode is represented by "1", it can be considered that the protected circuit 1 with a fault exists in the plurality of protected circuits 1.

When the fault diagnosis circuit is in the second working mode, the plurality of safety protection circuits 3 can output the first check result signals generated thereby. The second logic gate 53 can receive a plurality of first check result signals (equivalent to the parity 1 error to the parity n error in FIG. 4 and FIG. 5 in the second working mode) through a plurality of input ends, perform a second logical operation on the plurality of received first check result signals to obtain the second operation result signals (equivalent to the parity error in FIG. 4 and FIG. 5 in the second working mode), and output the second operation result signals from the fifteenth port P15.

Further, the second multiplexer 55 can receive, from the seventeenth port P17, the second operation result signals that are from second logic gate 53, and output the received second operation result signals from the eighth port P18. Based on the second operation result signals, a related person can learn whether the safety protection circuit 3 with a fault exists in the plurality of safety protection circuits 3.

In a specific example, each safety protection circuit 3 is provided with the second NOT gate 37 shown in FIG. 3. Theoretically, if there are no faults in the plurality of safety protection circuits 3, in the second working mode, the parity 1 error to the parity n error in FIG. 4 and FIG. 5 can all be represented by "1". Otherwise, in the second working mode, the parity 1 error to the parity n error in FIG. 4 and FIG. 5 can all be represented by "0".

In view of the above, it can be determined that if the second logic gate 53 is an AND gate, when the parity error in the second working mode is represented by "1", it can be considered that no safety protection circuit 3 with a fault exists in the plurality of safety protection circuits 3 in the fault diagnosis circuit. When the parity error in the second working mode is represented by "0", it can be considered that the safety protection circuit 3 with a fault exists in the plurality of safety protection circuits 3 in the fault diagnosis circuit.

Optionally, similar to the first multiplexer 313 described above, the second multiplexer 55 can also receive a diagnosis signal. Based on the received diagnosis signal, the second multiplexer 55 can determine whether the fault diagnosis circuit is currently in the first working mode or the second working mode.

In this embodiment of this disclosure, the diagnosis module 5 including the first logic gate 51, the second logic gate 53, and the second multiplexer 55 is disposed, so that whether the protected circuit 1 with a fault exists in the plurality of protected circuits 1 can be effectively and reliably determined based on the logical operation at the first logic gate 51; and whether the safety protection circuit 3 with a fault exists in the plurality of safety protection circuits 3 can be effectively and reliably determined based on the logical operation at the second logic gate 53. In other words, in this embodiment of this disclosure, the diagnosis module 5 can perform fault diagnoses on the protected circuits 1 in batches and perform fault diagnoses on the safety protection circuits 3 in batches.

In an optional example, as shown in FIG. 4, there are a plurality of safety protection circuits 3 and a plurality of protected circuits 1. The plurality of safety protection circuits 3 are electrically connected to the plurality of protected circuits 1 correspondingly. As shown in FIG. 5, the diagnosis module 5 includes a fault location circuit 57.

The fault location circuit 57 is electrically connected to each safety protection circuit 3 respectively.

When the fault diagnosis circuit is in the first working mode, the fault location circuit 57 is configured to output, based on a plurality of second check result signals that are generated by the plurality of safety protection circuits 3, a first indication signal used to indicate the protected circuit 1 with a fault in the plurality of protected circuits 1.

When the fault diagnosis circuit is in the second working mode, the fault location circuit 57 is configured to output, based on a plurality of first check result signals that are generated by the plurality of safety protection circuits 3, a second indication signal used to indicate the safety protection circuit 3 with a fault in the plurality of safety protection circuits 3.

Herein, there may be a plurality of (for example, n) safety protection circuits 3 and protected circuits 1, respectively, where n can be 2, 3, 4, 5, or an integer greater than 5. The plurality of safety protection circuits 3 can be electrically connected to the plurality of protected circuits 1 in one-to-one correspondence.

Herein, the fault location circuit 57 can have a nineteenth port P19 and a twentieth port P20. The nineteenth port P19 and the twentieth port P20 can respectively serve as an output end of the fault location circuit 57.

When the fault diagnosis circuit is in the first working mode, the fault location circuit 57 can scan the plurality of second check result signals (equivalent to the parity 1 error to the parity n error in FIG. 4 and FIG. 5 in the first working mode) generated by the plurality of safety protection circuits 3 in a set sequence, for example, scan the plurality of second check result signals in a sequence of error numbers from small to large or from large to small, to determine the protected circuit 1 with a fault that occurs in the plurality of protected circuits 1, and output the first indication signal (equivalent to a function error number in FIG. 4 and FIG. 5) from the nineteenth port P19 on this basis.

In a specific example, each safety protection circuit 3 is provided with the second NOT gate 37 shown in FIG. 3. Theoretically, if there are no faults in the plurality of protected circuits 1, in the first working mode, the parity 1 error to the parity n error in FIG. 4 and FIG. 5 can all be represented by "0". Otherwise, in the first working mode, an error in the parity 1 error to the parity n error in FIG. 4 and FIG. 5 that corresponds to the protected circuit 1 with a fault is represented by "1".

In view of the above, in the first working mode, if the parity 1 error to the parity n error in FIG. 4 and FIG. 5 are all represented by "0", the function error number can be "0" served as a default value. On this basis, the related person can learn that there are no faults in the plurality of protected circuits 1. In the first working mode, if a parity 2 error in FIG. 4 and FIG. 5 is represented by "1", the function error number can be "2". On this basis, the related person can learn that the protected circuit 1 corresponding to the parity 2 error has a fault. In the first working mode, if the parity 1 error and the parity 2 error in FIG. 4 and FIG. 5 are both represented by "1", the function error number can be "1", and on this basis, the related person can learn that the protected circuit 1 corresponding to the parity 1 error has a fault. Alternatively, the function error number can be "2", and on this basis, the related person can learn that the protected circuit 1 corresponding to the parity 2 error has a fault. In other words, when a quantity of protected circuits 1 with faults is at least one, the function error number can merely indicate the protected circuit 1 with a highest or lowest corresponding error number.

When the fault diagnosis circuit is in the second working mode, the fault location circuit 57 can scan the plurality of first check result signals (equivalent to the parity 1 error to the parity n error in FIG. 4 and FIG. 5 in the second working mode) generated by the plurality of safety protection circuits 3 in a set sequence, for example, scan the plurality of first check result signals in a sequence of error numbers from small to large or from large to small, to determine the safety protection circuit 3 with a fault that occurs in the plurality of safety protection circuits 3, and output the second indication signal (equivalent to a diagnosis error number in FIG. 4 and FIG. 5) from the twentieth port P20 on this basis.

In a specific example, each safety protection circuit 3 is provided with the second NOT gate 37 shown in FIG. 3. Theoretically, if there are no faults in the plurality of safety protection circuits 3, in the second working mode, the parity 1 error to the parity n error in FIG. 4 and FIG. 5 can all be represented by "1". Otherwise, in the second working mode, an error in the parity 1 error to the parity n error in FIG. 4 and FIG. 5 that corresponds to the safety protection circuits 3 with a fault is represented by "0".

In view of the above, in the second working mode, if the parity 1 error to the parity n error in FIG. 4 and FIG. 5 are all represented by "1", the diagnosis error number can be "0" served as the default value. On this basis, the related person can learn that there are no faults in the plurality of safety protection circuits 3. In the second working mode, if the parity 1 error in FIG. 4 and FIG. 5 is represented by "0", the diagnosis error number can be "1". On this basis, the related person can learn that the safety protection circuit 3 corresponding to the parity 1 error has a fault. In the second working mode, if the parity 1 error and the parity 2 error in FIG. 4 and FIG. 5 are both represented by "0", the diagnosis error number can be "1", and on this basis, the related person can learn that the safety protection circuit 3 corresponding to the parity 1 error has a fault. Alternatively, the diagnosis error number can be "2", and on this basis, the related person can learn that the safety protection circuit 3 corresponding to the parity 2 error has a fault. In other words, when a quantity of safety protection circuits 3 with faults is at least one, the diagnosis error number can merely indicate the safety protection circuit 3 with a highest or lowest corresponding error number.

In this embodiment of this disclosure, the fault location circuit 57 is disposed, so that errors in all protected circuits 1 and errors in the safety protection circuits 3 can be collected and located. Specifically, the fault location circuit 57 can output the first indication signal in the first working mode to accurately indicate a location of the protected circuit 1 with a fault, and output the second indication signal in the second working mode to accurately indicate a location of the safety protection circuit 3 with a fault.

Figure 6:
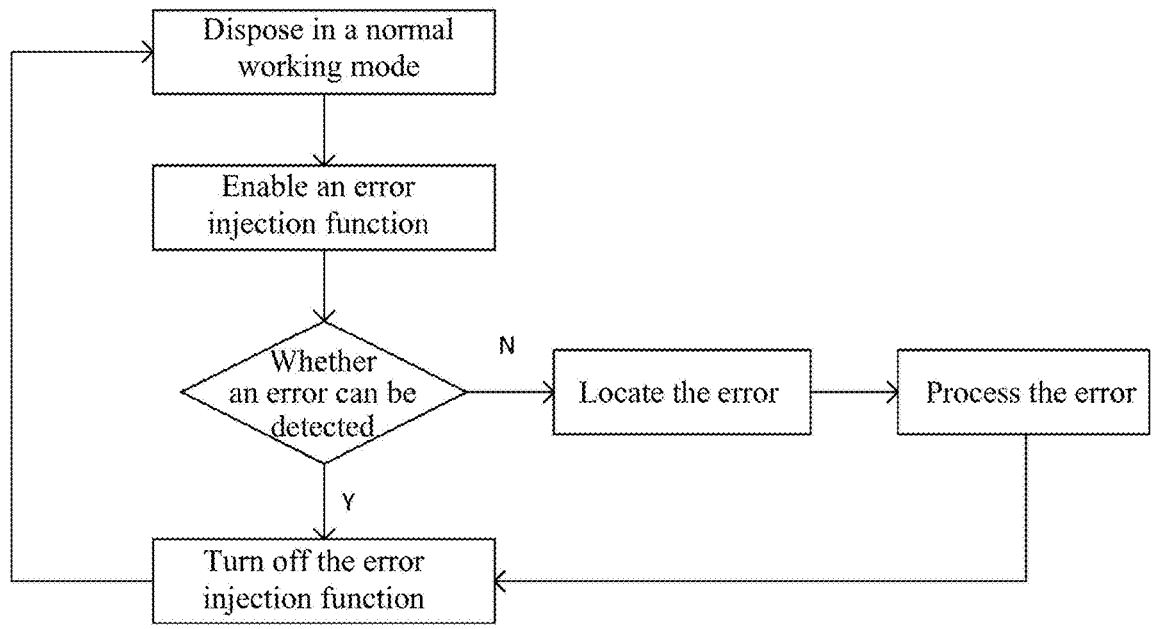
FIG. 6 is a schematic flowchart of error injection in a fault diagnosis circuit according to an exemplary embodiment of this disclosure.

In an optional example, as shown in FIG. 6, the fault diagnosis circuit is first disposed in the normal working mode. After the fault diagnosis circuit is powered on and initialized, an error injection function can be enabled through software to dispose the fault diagnosis circuit in an error injection mode. Subsequently, it is determined whether an error can be detected in the error injection mode (equivalent to detecting whether the parity 1 error to the parity n error in FIG. 4 and FIG. 5 are all represented by "1" in the second working mode). If an error can be detected in the error injection mode (equivalent to a case in which the parity 1 error to the parity n error in FIG. 4 and FIG. 5 are all represented by "1" in the second working mode), it can be considered a succeeds, and that there are no potential faults in all safety protection circuits 3 in FIG. 4. In this case, the error injection function can be turned off and a normal working mode can be switched to.

If no error can be detected in the error injection mode (equivalent to a case in which at least some errors in the parity 1 error to the parity n error in FIG. 4 and FIG. 5 are not represented by "1" in the second working mode), the error can be located (equivalent to determining which specific safety protection circuits 3 have faults) and processed. For example, the stored data is re-written into each protected circuit 1 in FIG. 4, or an intelligent property (IP) module is restarted. The IP module refers to a module that can implement certain functions.

In view of the above, the fault diagnosis circuit provided in this embodiment of this disclosure can be used to diagnose all protected circuits 1 in batches in the normal working mode. If the protected circuit 1 has a fault, the location of the protected circuit 1 with a fault is accurately indicated. In the error injection mode, negation processing can be performed in batches based on the first NOT gate 311 described above, without annotating the errors separately, thereby greatly improving error injection efficiency. The software can diagnose all safety protection circuits 3 in batches through only one operation. If the safety protection circuit 3 has a fault, the location of the safety protection circuit 3 with a fault is accurately indicated.

Exemplary Method

Figure 7:
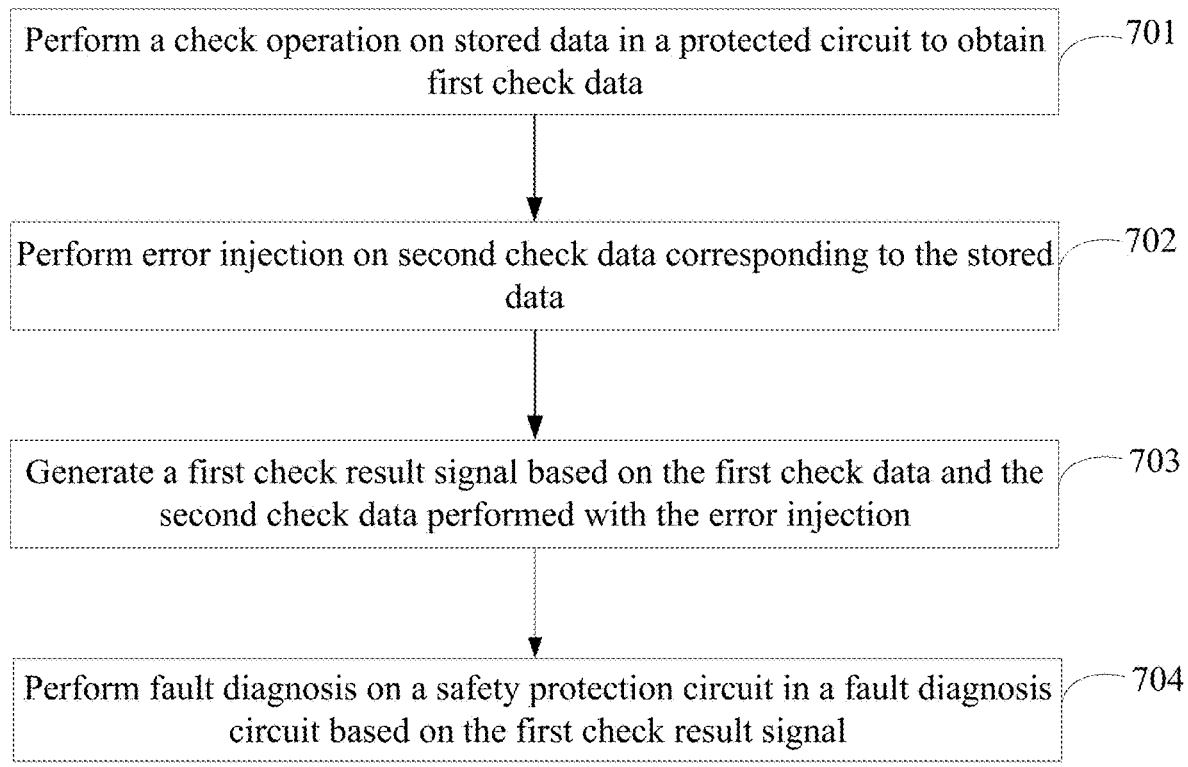
FIG. 7 is a schematic flowchart of a fault diagnosis method according to an exemplary embodiment of this disclosure.

FIG. 7 is a schematic flowchart of a fault diagnosis method according to an exemplary embodiment of this disclosure. The method shown in FIG. 7 is applicable to the fault diagnosis circuit described above. The method shown in FIG. 7 includes step 701, step 702, step 703, and step 704.

Step 701: Perform a check operation on stored data in a protected circuit to obtain first check data.

Step 702: Perform error injection on second check data corresponding to the stored data.

Step 703: Generate a first check result signal based on the first check data and the second check data performed with the error injection.

Step 704: Perform fault diagnosis on a safety protection circuit in the fault diagnosis circuit based on the first check result signal.

Figure 8:
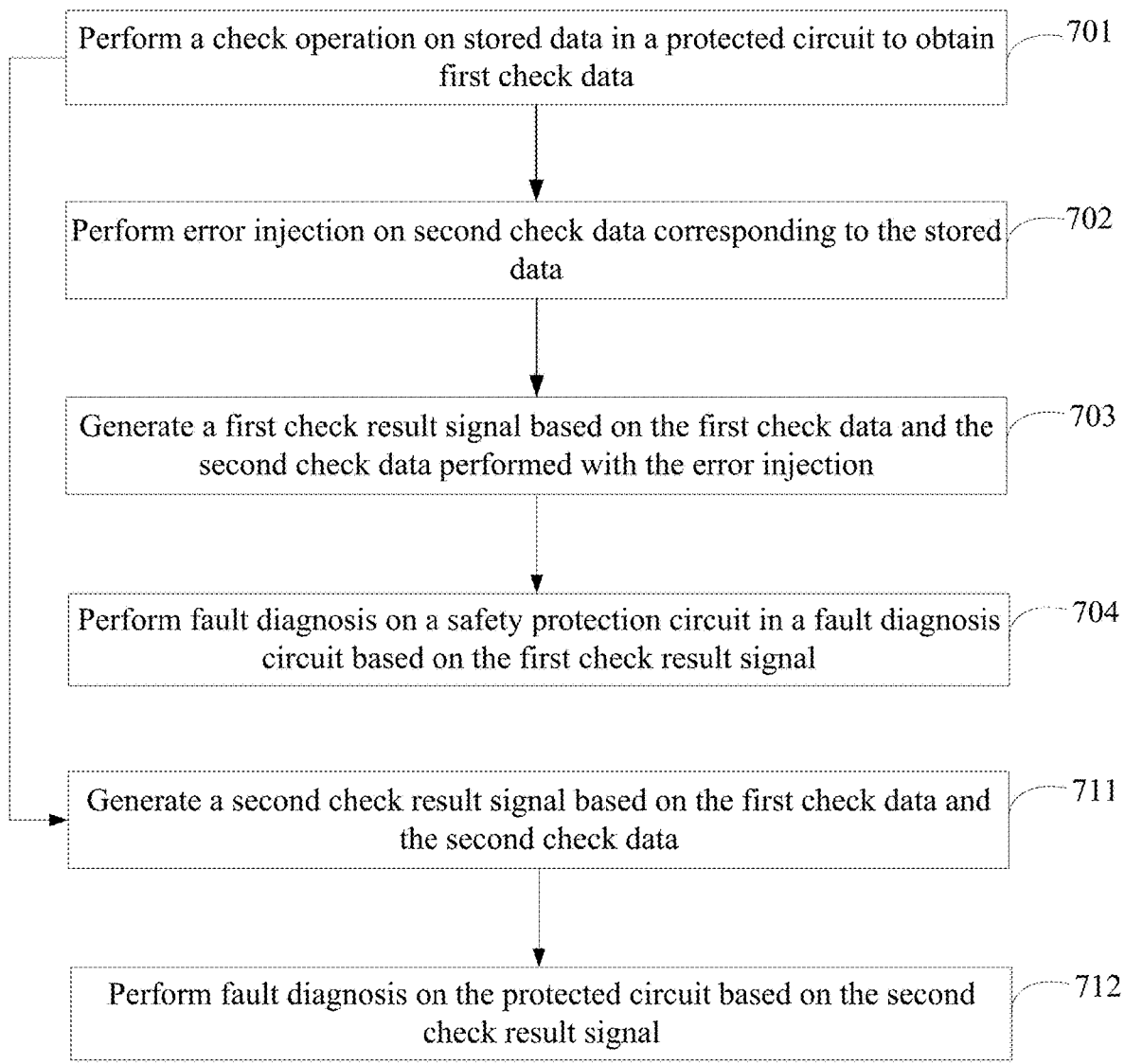
FIG. 8 is a schematic flowchart of a fault diagnosis method according to another exemplary embodiment of this disclosure.

In an optional example, as shown in FIG. 8, the fault diagnosis method further includes the following steps.

Step 711: Generate a second check result signal based on the first check data and the second check data.

Step 712: Perform fault diagnosis on the protected circuit based on the second check result signal.

Any fault diagnosis method provided in the embodiments of this disclosure can be implemented by any suitable device with a data processing capability, including but not limited to a terminal device and a server. Alternatively, any fault diagnosis method provided in the embodiments of this disclosure can be implemented by a processor. For example, the processor implements any fault diagnosis method described in the embodiments of this disclosure by invoking a corresponding instruction stored in a memory. Details are not described below again.

Exemplary Apparatus

Figure 9:
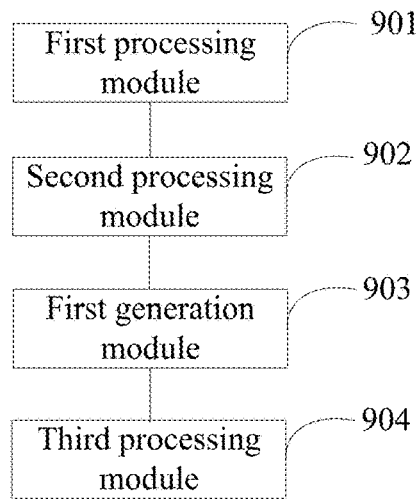
FIG. 9 is a schematic structural diagram of a fault diagnosis apparatus according to an exemplary embodiment of this disclosure.

FIG. 9 is a schematic structural diagram of a fault diagnosis apparatus according to an exemplary embodiment of this disclosure. The apparatus shown in FIG. 9 includes a first processing module 901, a second processing module 902, a first generation module 903, and a third processing module 904.

The first processing module 901 is configured to perform a check operation on stored data in a protected circuit to obtain first check data.

The second processing module 902 is configured to perform error injection on second check data corresponding to the stored data.

The first generation module 903 is configured to generate a first check result signal based on the first check data obtained by the first processing module 901 and the second check data performed with the error injection that is obtained by the second processing module 902.

The third processing module 904 is configured to perform fault diagnosis on a safety protection circuit in the fault diagnosis circuit based on the first check result signal generated by the first generation module 903.

Figure 10:
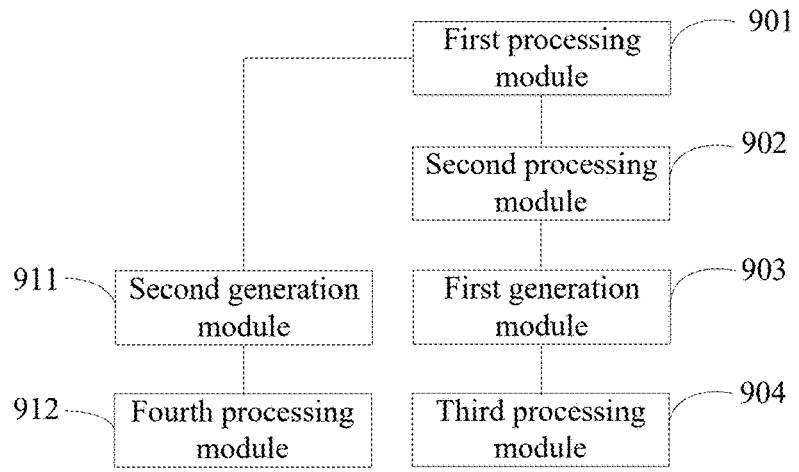
FIG. 10 is a schematic structural diagram of a fault diagnosis apparatus according to another exemplary embodiment of this disclosure.

In an optional example, as shown in FIG. 10, the fault diagnosis apparatus further includes:

a second generation module 911, configured to generate a second check result signal based on the first check data obtained by the first processing module 901 and the second check data; and a fourth processing module 912, configured to perform fault diagnosis on the protected circuit based on the second check result signal generated by second first generation module 911.

Exemplary Electronic Device

An electronic device according to an embodiment of this disclosure is described below with reference to FIG. 11. The electronic device may be any one or two of a first device and a second device, or a stand-alone device separated from the first device and the second device. The stand-alone device may communicate with the first device and the second device, to receive an obtained input signal therefrom.

Figure 11:
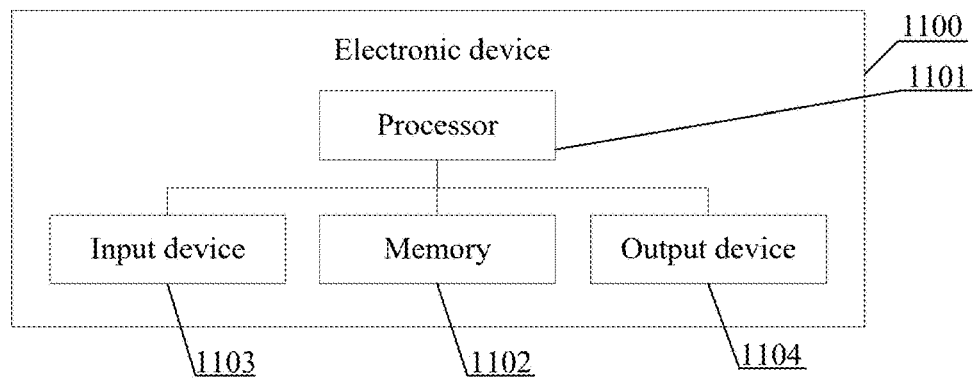
FIG. 11 is a structural diagram of an electronic device according to an exemplary embodiment of this disclosure.

FIG. 11 shows a block diagram of an electronic device according to an embodiment of the present disclosure.

As shown in FIG. 11, an electronic device 1100 includes one or more processors 1101 and a memory 1102.

The processor 1101 may be a CPU or another form of processing unit having a data processing capability and/or an instruction execution capability, and may control another component in the electronic device 1100 to perform a desired function.

The memory 1102 can include one or more computer program products. The computer program product can include various forms of computer readable storage media, such as a volatile memory and/or a non-volatile memory. The volatile memory can include, for example, a random access memory (RAM) and/or a cache. The nonvolatile memory can include, for example, a read-only memory (ROM), a hard disk, and a flash memory. One or more computer program instructions can be stored on the computer readable storage medium. The processor 1101 can execute the program instruction to implement the fault diagnosis method according to various embodiments of this disclosure that are described above and/or other desired functions. Various contents such as an input signal, a signal component, and a noise component can also be stored in the computer readable storage medium.

In an example, the electronic device 1100 can further include an input device 1103 and an output device 1104. These components are connected with each other through a bus system and/or another form of connection mechanism (not shown).

For example, when the electronic device is the first device or the second device, the input device 1103 may be a microphone or a microphone array. When the electronic device is a stand-alone device, the input device 1103 may be a communication network connector for receiving the collected input signal from the first device and the second device.

In addition, the input device 1103 may further include, for example, a keyboard and a mouse.

The output device 1104 can output various information to the outside, including determined distance information, direction information, and the like. The output device 1104 may include, for example, a display, a loudspeaker, a printer, a communication network, and a remote output device connected by the communication network.

Certainly, for simplicity, FIG. 11 shows only some of components in the electronic device 1100 that are related to this disclosure, and components such as a bus and an input/output interface are omitted. In addition, according to specific application situations, the electronic device 1100 can further include any other appropriate components.

Exemplary Computer Program Product and Computer Readable Storage Medium

In addition to the foregoing method and device, the embodiments of this disclosure can also relate to a computer program product, which includes computer program instructions. When the computer program instructions are run by a processor, the processor is enabled to perform the steps, of the fault diagnosis method according to the embodiments of this disclosure, that are described in the "exemplary method" part of this specification.

Basic principles of this disclosure are described above in combination with specific embodiments. However, it should be pointed out that the advantages, superiorities, and effects mentioned in this disclosure are merely examples but are not for limitation, and it cannot be considered that these advantages, superiorities, and effects are necessary for each embodiment of this disclosure. In addition, specific details described above are merely for examples and for ease of understanding, rather than limitations. The details described above do not limit that this disclosure must be implemented by using the foregoing specific details.

The various embodiments in this specification are all described in a progressive way, and each embodiment focuses on a difference from other embodiments. For same or similar parts among the various embodiments, reference can be made to each other. The system embodiments basically correspond to the method embodiments, and thus are relatively simply described. For related parts, reference can be made to a part of the descriptions of the method embodiments.

The block diagrams of the equipment, the apparatus, the device, and the system involved in this disclosure are merely exemplary examples and are not intended to require or imply that the equipment, the apparatus, the device, and the system must be connected, arranged, and configured in the manners shown in the block diagrams. It is recognized by a person skilled in the art that, the equipment, the apparatus, the device, and the system can be connected, arranged, and configured in an arbitrary manner.

The method and the apparatus in this disclosure can be implemented in many ways. For example, the method and the apparatus in this disclosure can be implemented by software, hardware, firmware, or any combination of the software, the hardware, and the firmware. The foregoing sequence of the steps of the method is for illustration only, and the steps of the method in this disclosure are not limited to the sequence specifically described above, unless otherwise specifically stated in any other manner. In addition, in some embodiments, this disclosure can also be implemented as programs recorded in a recording medium. These programs include machine-readable instructions for implementing the method according to this disclosure. Therefore, this disclosure further relates to a recording medium storing a program for implementing the method according to this disclosure.

It should be further pointed out that, various components or various steps in the apparatus, the device, and the method of this disclosure can be disassembled and/or recombined. These disassembling and/or recombinations shall be regarded as equivalent solutions of this disclosure.

The foregoing description about the disclosed aspects is provided, so that this disclosure can be arrived at or carried out by any person skilled in the art. Various modifications to these aspects are very obvious to a person skilled in the art. Moreover, general principles defined herein can be applicable to other aspects without departing from the scope of this disclosure. Therefore, this disclosure is not intended to be limited to the aspects illustrated herein, but to the widest scope consistent with the principles and novel features disclosed herein.

What is claimed is:

1. A circuit for diagnosing a fault, comprising: a safety protection circuit and a diagnosis module,
    wherein the safety protection circuit is electrically connected to a protected circuit and a data bus, and is configured to perform a check operation on stored data in the protected circuit to obtain first check data, obtain second check data corresponding to the stored data based on the data bus, perform error injection on the second check data, and generate a first check result signal based on the first check data and based on the second check data which is performed with the error injection; and
    wherein the diagnosis module is electrically connected to the safety protection circuit, and the diagnosis module is configured to perform fault diagnosis on the safety protection circuit based on the first check result signal.

2. The circuit according to claim 1, wherein the safety protection circuit is further configured to generate a second check result signal based on the first check data and the second check data; and
    the diagnosis module is further configured to perform fault diagnosis on the protected circuit based on the second check result signal.

3. The circuit according to claim 2, wherein the safety protection circuit comprises a processing module, a calculation module, and a comparison module;
    the comparison module is respectively electrically connected to the processing module, the calculation module, and the diagnosis module, and the calculation module is further electrically connected to the protected circuit;
    the calculation module is configured to perform a check operation on the stored data to obtain the first check data;
    the processing module is configured to perform error injection on the second check data;
    the comparison module is configured to generate a third check result signal based on a comparison result between the first check data and the second check data which is performed with the error injection, wherein the first check result signal is generated based on the third check result signal; and the comparison module is further configured to generate a fourth check result signal based on a comparison result between the first check data and the second check data, wherein the second check result signal is generated based on the fourth check result signal.

4. The circuit according to claim 3, wherein the processing module comprises a first NOT gate, a first multiplexer and a memory;
the first multiplexer is electrically connected to the memory, the memory is further electrically connected to the first multiplexer through the first NOT gate, the first multiplexer is further electrically connected to a data bus, and the memory is further electrically connected to the comparison module;
when the fault diagnosis circuit is in a first working mode, the first multiplexer is configured to output the second check data that is obtained based on the data bus, so that the memory stores the second check data and outputs the second check data to the comparison module; and
when the fault diagnosis circuit is in a second working mode, the first multiplexer is configured to output a negation result of the second check data stored in the memory which is inverted by the first NOT gate, so that the memory outputs the negation result of the second check data to the comparison module, wherein the negation result of the second check data is used as the second check data performed with the error injection.

5. The circuit according to claim 4, wherein the safety protection circuit further comprises a second NOT gate; and
the comparison module is electrically connected to the diagnosis module through the second NOT gate, a negation result of the third check result signal which is inverted by the second NOT gate is used as the first check result signal, and a negation result of the fourth check result signal which is inverted by the second NOT gate is used as the second check result signal.

6. The circuit according to claim 2, wherein there are a plurality of safety protection circuits and a plurality of protected circuits, and the plurality of safety protection circuits are electrically connected to the plurality of protected circuits correspondingly; and the diagnosis module comprises a first logic gate, a second logic gate, and a second multiplexer;
the first logic gate and the second logic gate are respectively electrically connected to each of the safety protection circuits, and the first logic gate and the second logic gate are further electrically connected to the second multiplexer;
when the fault diagnosis circuit is in a first working mode, the second multiplexer is configured to output a first operation result signal obtained by performing, by the first logic gate, first logical operation on a plurality of second check result signals that are generated by the plurality of safety protection circuits, wherein the first operation result signal is used to indicate whether the protected circuit having a fault exists in the plurality of protected circuits; and
when the fault diagnosis circuit is in a second working mode, the second multiplexer is configured to output a second operation result signal obtained by performing, by the second logic gate, a second logical operation on a plurality of first check result signals that are generated by the plurality of safety protection circuits, wherein the second operation result signal is used to indicate whether the safety protection circuit having a fault exists in the plurality of safety protection circuit circuits.

7. The circuit according to claim 2, wherein there are a plurality of safety protection circuits and a plurality of protected circuits, and the plurality of safety protection circuits are electrically connected to the plurality of protected circuits correspondingly; and the diagnosis module comprises a fault location circuit;
wherein the fault location circuit is electrically connected to each of the safety protection circuits respectively;
when the fault diagnosis circuit is in a first working mode, the fault location circuit is configured to output, based on a plurality of the second check result signals that are generated by the plurality of the safety protection circuits, a first indication signal used to indicate the protected circuit having a fault in the plurality of the protected circuits; and
when the fault diagnosis circuit is in a second working mode, the fault location circuit is configured to output, based on a plurality of the first check result signals that are generated by the plurality of the safety protection circuits, a second indication signal used to indicate the safety protection circuit having a fault in the plurality of the safety protection circuits.

8. A method for diagnosing a fault, applicable to a circuit for diagnosing a fault, wherein the method comprises:
performing a check operation on stored data in a protected circuit to obtain first check data;
obtaining second check data corresponding to the stored data based on a data bus connected to a safety protection circuit of the circuit for diagnosing a fault, and performing error injection on the second check data;
generating a first check result signal based on the first check data and based on the second check data which is performed with the error injection; and
performing fault diagnosis on a safety protection circuit in the circuit based on the first check result signal.

9. The method according to claim 8, further comprising:
generating a second check result signal based on the first check data and the second check data; and
performing fault diagnosis on the protected circuit based on the second check result signal.

10. A non-transitory computer readable storage medium, wherein the storage medium stores a computer program, and the computer program is used for implementing the fault diagnosis method according to claim 8.

11. The non-transitory computer readable storage medium according to claim 10, wherein the fault diagnosis method further comprises:
generating a second check result signal based on the first check data and the second check data; and
performing fault diagnosis on the protected circuit based on the second check result signal.

12. The method according to claim 8, wherein the circuit comprises a safety protection circuit and a diagnosis module,
wherein the safety protection circuit is electrically connected to a protected circuit, and is configured to perform a check operation on stored data in the protected circuit to obtain first check data, perform error injection on second check data corresponding to the stored data, and generate a first check result signal based on the first check data and based on the second check data which is performed with the error injection; and
wherein the diagnosis module is electrically connected to the safety protection circuit, and the diagnosis module is configured to perform fault diagnosis on the safety protection circuit based on the first check result signal.

13. The method according to claim 12, further comprising:
  generating a second check result signal based on the first check data and the second check data; and
  performing fault diagnosis on the protected circuit based on the second check result signal.

\* \* \* \* \*